United States Patent
Chen et al.

(10) Patent No.: US 7,312,613 B1
(45) Date of Patent: Dec. 25, 2007

(54) METHOD FOR NETWORK DIAGNOSTIC

(75) Inventors: Tien-Hui Chen, Taipei (TW); Yi-Hua Lai, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 11/463,913

(22) Filed: Aug. 11, 2006

(51) Int. Cl.
*G01R 31/11* (2006.01)
*G01R 31/02* (2006.01)

(52) U.S. Cl. .................. 324/534; 324/533; 324/543

(58) Field of Classification Search .............. 324/512, 324/527, 528, 532–535, 543
See application file for complete search history.

(56) References Cited

U.S. PATENT DOCUMENTS

| | | | |
|---|---|---|---|
| 4,859,951 A * | 8/1989 | Cole et al. ............... | 324/534 |
| 6,534,996 B1 * | 3/2003 | Amrany et al. ........... | 324/533 |
| 6,867,600 B1 * | 3/2005 | Iskanius et al. .......... | 324/534 |
| 6,934,655 B2 * | 8/2005 | Jones et al. .............. | 324/534 |
| 2006/0181283 A1 * | 8/2006 | Wajcer et al. ............ | 324/539 |

* cited by examiner

*Primary Examiner*—Anjan Deb
*Assistant Examiner*—Timothy J Dole
(74) *Attorney, Agent, or Firm*—Thomas, Kayden, Horstemeyer & Risley

(57) ABSTRACT

A method for network diagnosis between a source end and a destination end coupled by a transmission line is provided. The method includes the following steps. First, a first test signal is transmitted from the transmitter to the receiver when the hybrid is set to a first mode. Next, a plurality of first coefficients are extracted from the first test signal received by the canceller during a first period, wherein each one of the first coefficients has an index corresponding to a received order. And then, the hybrid is switched to a second mode to generate a second test signal by sending an original signal to the receiver and the destination. Sequentially, a plurality of second coefficients are extracted from the second test signal received by the canceller during a second period, wherein each one of the second coefficients has an index corresponding to a received order. Therefore, a first index is determined when an absolute value of one of the first coefficients substantially exceeds a first threshold value. A second index and a polarity of a peak are determined according to a referenced signal that is obtained by subtracting the first coefficients from the second coefficients. At last, a location with a cabling issue is determined according to the first index and the second index.

21 Claims, 5 Drawing Sheets

METHOD FOR NETWORK DIAGNOSTIC

BACKGROUND OF THE INVENTION

1. Field of the Invention

The invention relates to a network diagnostic method, and in particular relates to a Gigabit Ethernet network diagnostic method.

2. Description of the Related Art

Computer network transmission lines can be destroyed by a variety of causes, for example, oxidation, humidity, excavation, or other unknown causes resulting in various conditions, such as, a cable open, a cable short, and an impedance mismatch. A cable open exists when a lack of continuity occurs between the pins at each end of the cable. A cable short occurs when two or more conductors short circuits. When two metallic conductors are placed close together, the characteristic impedance of a transmission line (cable) occurs. A correctly terminated line is defined that both the source impedance and the load impedance are equal to the characteristic impedance of a transmission line (cable). For a perfectly terminated line, the reflected wave is zero. In this case, the destination (load) absorbs all the energy of the source wave. However, an impedance mismatch occurs when either the source impedance or the load impedance differs from the characteristic impedance of the transmission line (cable).

Time Domain Reflectometry (TDR), similar to the principle of the radar, is the analysis of a conductor (wire, cable, or optical fiber) by sending a pulsed signal into the conductor, and then examining the reflection of the pulsed signal. When the transmitted pulse reaches the end of the cable, or a fault along the cable, part or all of the pulse energy is reflected back to the source. By examining the polarity, amplitude, frequencies, or other electrical signatures of all reflections, tampering or bugs may be precisely located. Accordingly, TDR technology can be utilized to remotely and non-evasively locate and identify cabling problems such as cable opens, cable shorts, or any impedance mismatches. Any wire with fault will cause a detectable anomaly, and the technician will then perform a physical inspection at the location of the anomaly.

FIG. 1a to FIG. 1d illustrate various cable conditions that can be diagnosed by Time Domain Reflectometry (TDR).

FIG. 1a illustrates a source wave and its corresponding reflected wave in a cable open condition in accordance with TDR. As shown in FIG. 1a, a source wave 11 with amplitude As is sent and a reflected wave 12 with an amplitude Ar1 is received after a period of time Tr. The reflected wave 12 is identical to the source wave 11, since the load impedance is regarded as infinite and the load reflects all the energy of the source wave. Accordingly, the reflected wave 12 has the same amplitude and polarity as the source wave 11.

FIG. 1b illustrates a source wave and its corresponding reflected wave in a cable short condition in accordance with TDR. As shown in FIG. 1b, a source wave 13 with amplitude As is sent and a reflected wave 14 with an amplitude Ar2 is received after a period of time Tr. The magnitude of the amplitude Ar2 of the reflected wave 14 is equal to that of the source wave 13, i.e., As, while the polarities of the reflected wave 14 and the source wave 13 are opposite.

FIG. 1c illustrates a source wave and its corresponding reflected wave when the load impedance is greater than the source impedance in accordance with TDR. As shown in FIG. 1c, a source wave 15 with amplitude As is sent and a reflected wave 16 with an amplitude Ar3 is received after a period of time Tr. The magnitude of the amplitude Ar3 of the reflected wave 16 is below that of the source wave 15, i.e., As, and the polarities of the reflected wave 16 and the source wave 15 are the same.

FIG. 1d illustrates a source wave and its corresponding reflected wave when the load impedance is below the source impedance in accordance with TDR. As shown in FIG. 1d, a source wave 17 with amplitude As is sent and a reflected wave 18 with an amplitude Ar4 is received after a period of time Tr. The magnitude of the amplitude Ar4 of the reflected wave 18 is below that of the source wave 17, i.e., As, and the polarities of the reflected wave 18 and the source wave 17 are opposite.

BRIEF SUMMARY OF THE INVENTION

In view of the foregoing, by utilizing the theory of TDR, this invention provides a method for network diagnostic between a source end and a destination end coupled by a transmission line, wherein the source end includes a transmitter, a receiver, a canceller, and a hybrid. The method includes the following steps. First, a first test signal is transmitted from the transmitter to the receiver when the hybrid is set to a first mode. Next, a plurality of first coefficients are extracted from the first test signal received by the canceller during a first period, wherein each one of the first coefficients has an index corresponding to a received order. And then, the hybrid is switched to a second mode to generate a second test signal by sending an original signal to the receiver and the destination. Sequentially, a plurality of second coefficients are extracted from the second test signal received by the canceller during a second period, wherein each one of the second coefficients has an index corresponding to a received order. Therefore, a first index is determined when an absolute value of one of the first coefficients substantially exceeds a first threshold value. A second index and a polarity of a peak are determined according to a referenced signal that is obtained by subtracting the first coefficients from the second coefficients. At last, a location with a cabling issue is determined according to the first index and the second index.

As described above, the method includes the following steps. First, a plurality of first coefficients are extracted from a first-test signal to be stored during a first period when a hybrid is set to a first mode. Next, a plurality of second coefficients are extracted from a second test signal to be stored during a second period after the hybrid is switched to a second mode. And then, a first index is determined when an absolute value of one of the first coefficients substantially exceeds a first threshold value. A second index and a polarity of a peak are determined according to a referenced signal that is obtained by subtracting the first coefficients from the second coefficients. At last, a location with a cabling issue is determined according to the first index and the second index.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2b reveals the details of the source end shown in FIG. 2a;

FIG. 3b illustrates the flowchart of the method for network diagnostic in accordance with an embodiment of the invention following FIG. 3a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
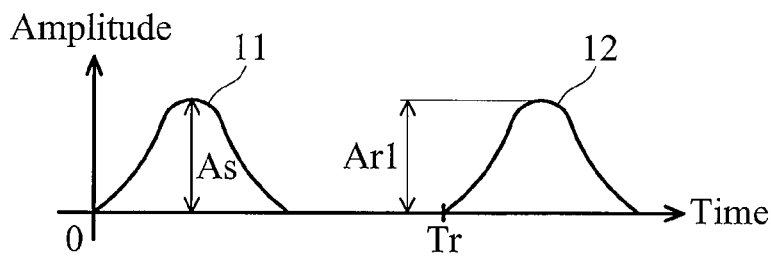
FIG. 1a illustrates a source wave and its corresponding reflected wave in a cable open condition.
Figure 1B:
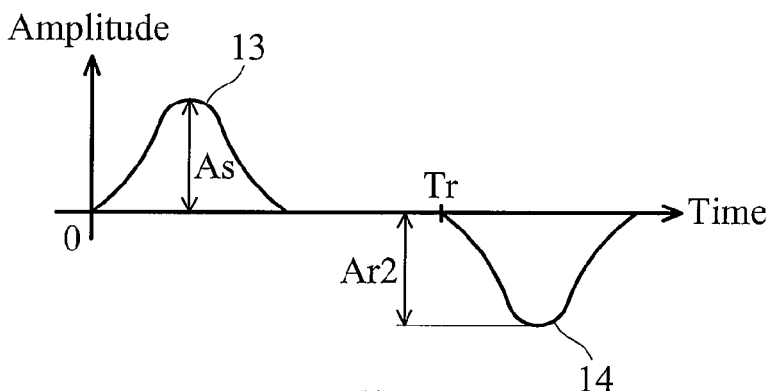
FIG. 1b illustrates a source wave and its corresponding reflected wave in a cable short condition.
Figure 1C:
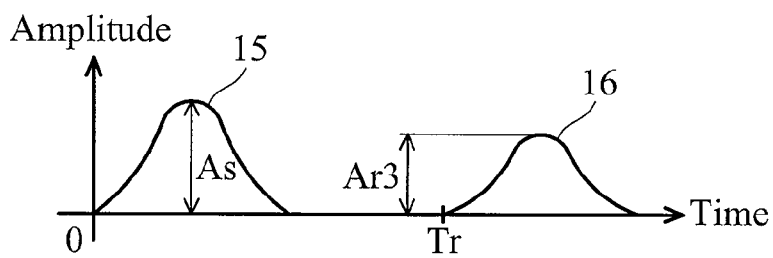
FIG. 1c illustrates a source wave and its corresponding reflected wave when the load impedance is greater than the source impedance.
Figure 1D:
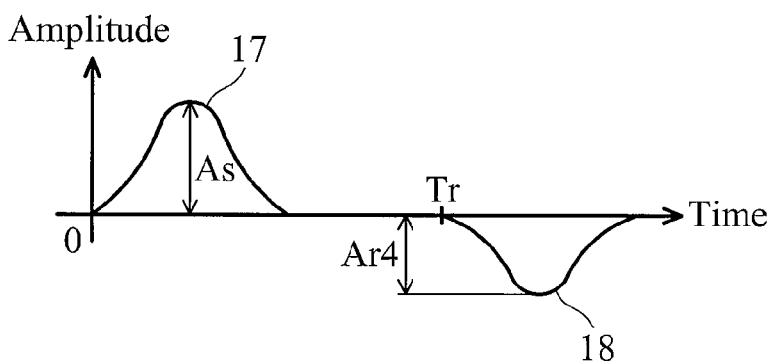
FIG. 1d illustrates a source wave and its corresponding reflected wave when the load impedance is under the source impedance.
Figure 2A:
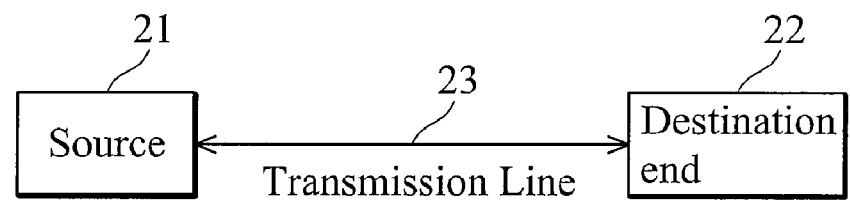
FIG. 2a is a schematic diagram of a computer network to be diagnosed.
Figure 2B:
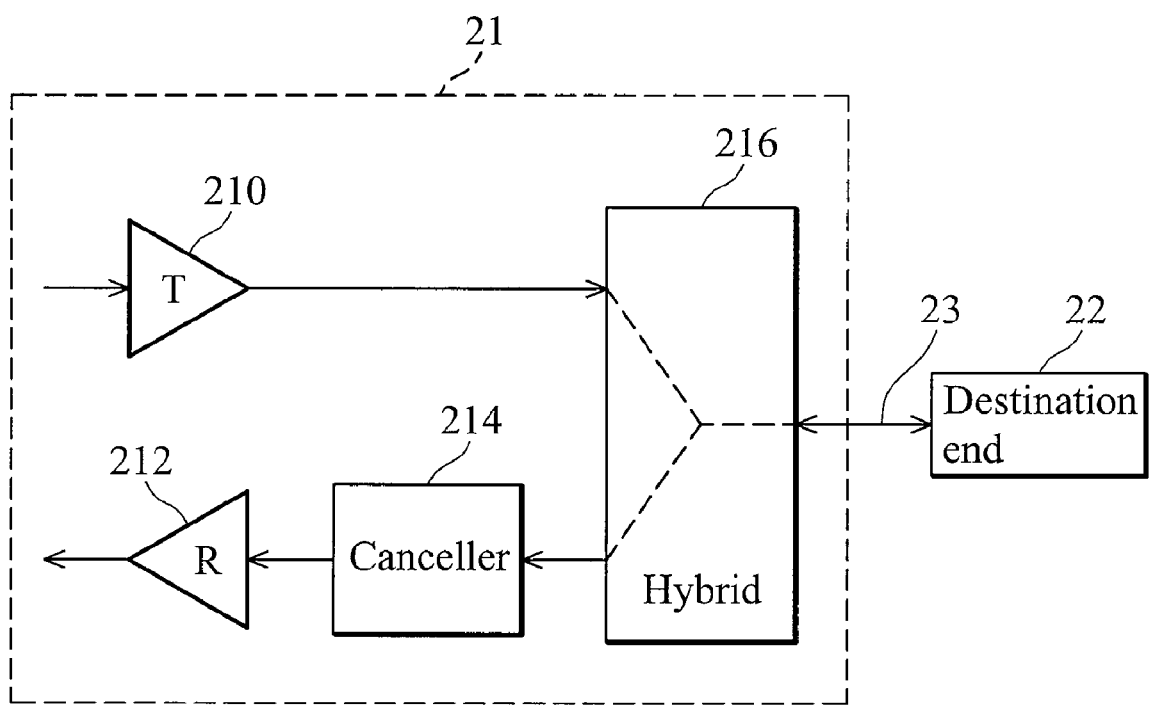

FIG. 2a is a schematic diagram of a computer network to be diagnosed. The computer network includes a source end 21 and a destination end 22 coupled by a transmission line 23. FIG. 2b reveals the details of the source end 21 shown in FIG. 2a. The source end 21 includes a transmitter 210, a receiver 212, a canceller 214, and a hybrid 216. The transmitter 210 and receiver 212 are coupled to the canceller 214 which eliminates echo noises. The hybrid 216 is coupled to the canceller 214 and the transmission line 23 for implementing bi-directional full duplex transmission.

Figure 3A:
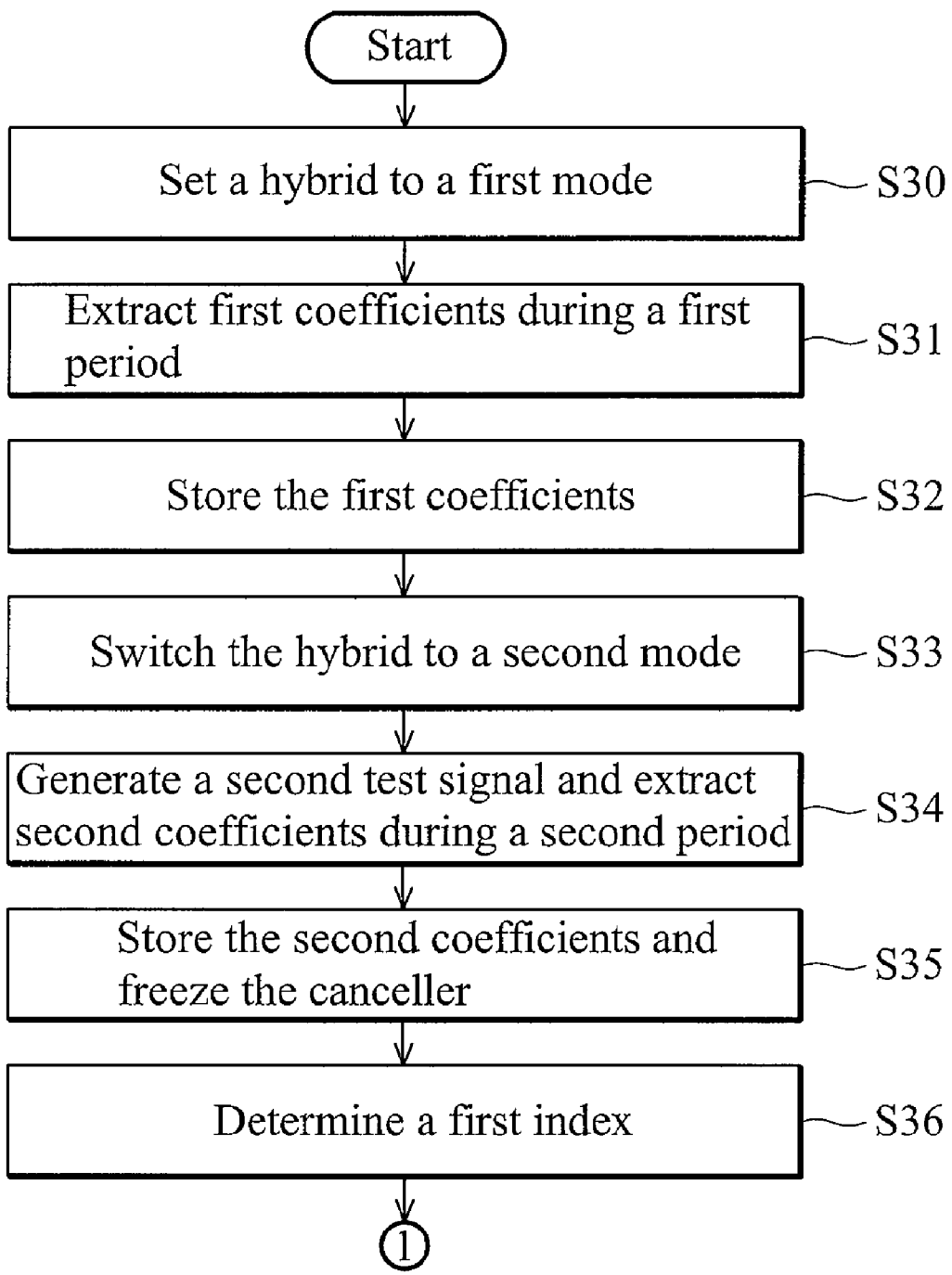
FIG. 3a illustrates a flowchart of a method for network diagnostic in accordance with an embodiment of the invention.
Figure 3B:
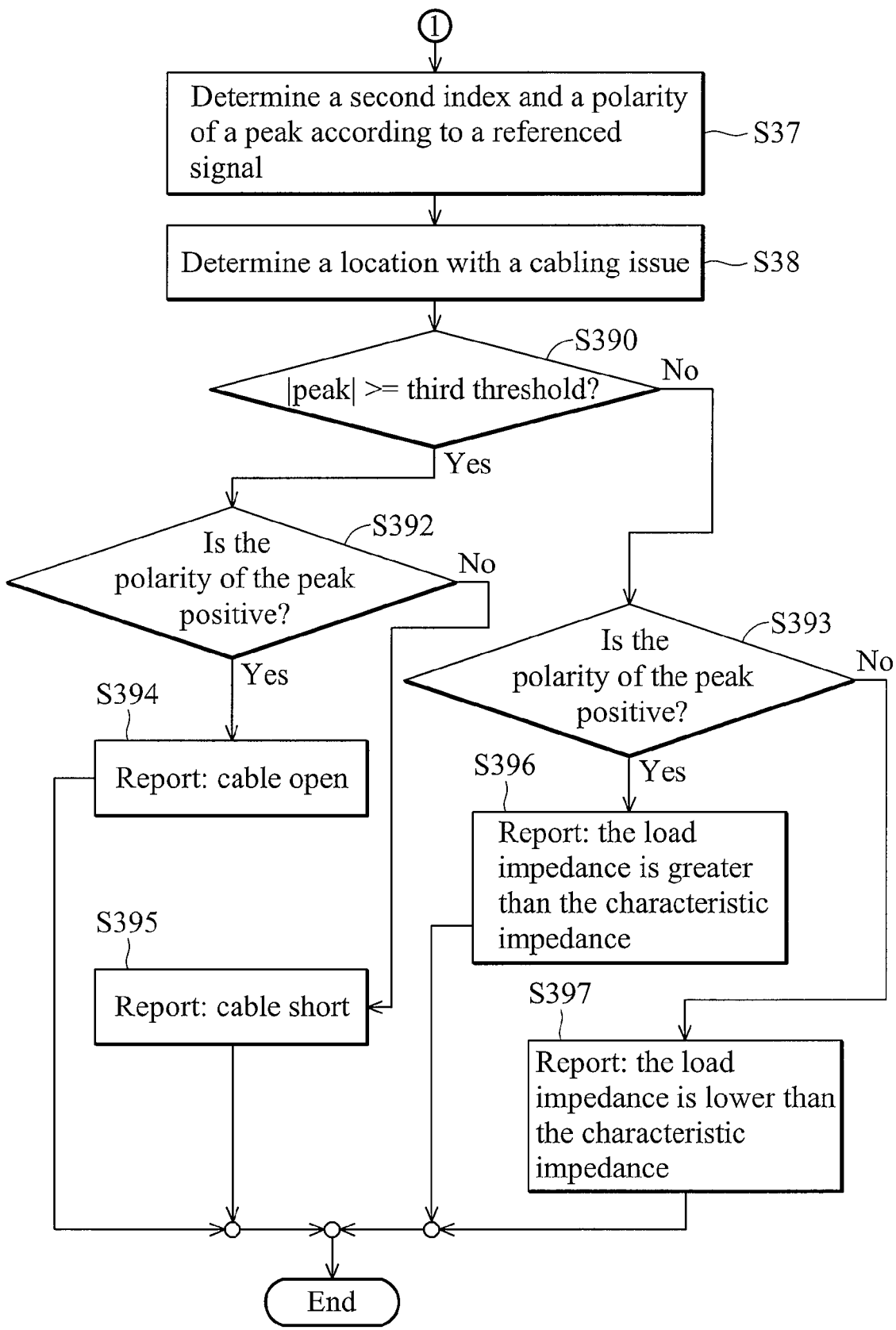
Figure 4A:
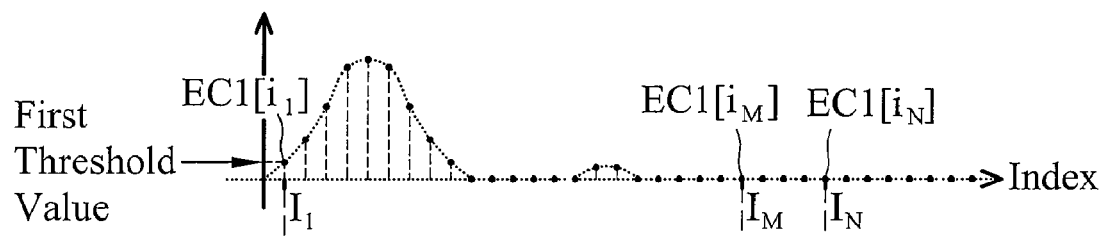
FIG. 4a illustrates a train of a first coefficients extracted from a first test received by a canceller.
Figure 4B:
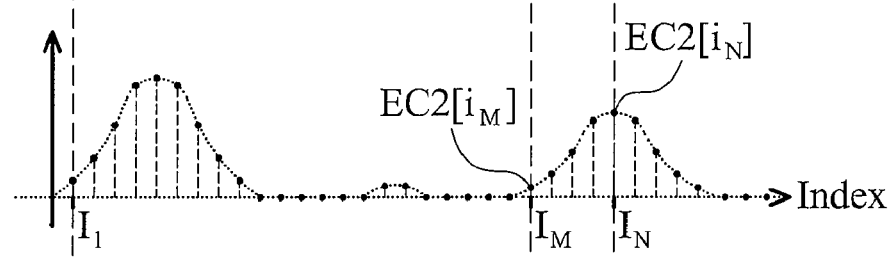
FIG. 4b illustrates a train of a second coefficients extracted from a second test signal received by the canceller.
Figure 4C:
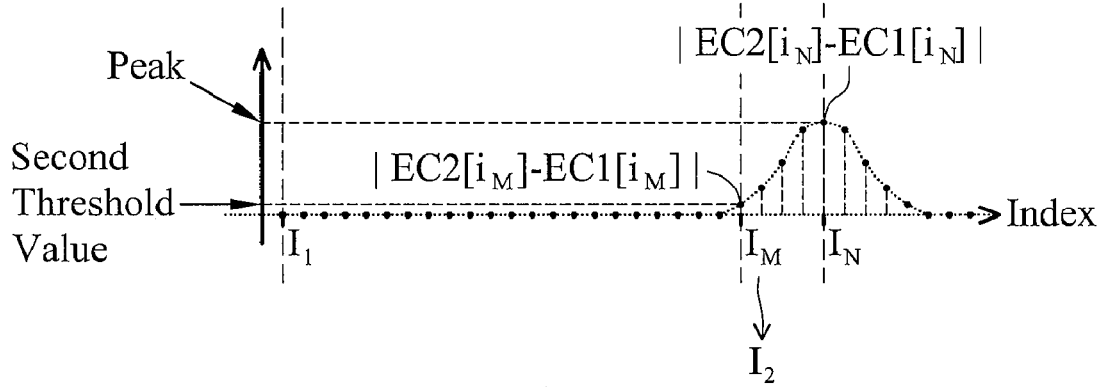
FIG. 4c illustrates a referenced signal that is obtained by subtracting the first coefficients from the second coefficients.

FIG. 3a and FIG. 3b illustrate a flowchart of a method for network diagnostic between a source end 21 and a destination end 22 coupled by a transmission line (cable) in accordance with an embodiment of the invention. FIG. 4a illustrates a train of a first coefficients extracted from a first test signal received by a canceller 214. FIG. 4b illustrates a train of second coefficients extracted from a second test signal received by the canceller 214. FIG. 4c illustrates a referenced signal that is obtained by subtracting the first coefficients from the second coefficients.

As shown in FIG. 3a, at first, a hybrid 216 is set to a first mode in step S30. The hybrid 216 coordinates the outbound signal and the inbound signal to implement bi-directional full duplex transmission. When the hybrid 216 is set to the first mode, i.e., a short mode, a first test signal is sent from a transmitter 210 to a receiver 212 with transmitting none of the first test signal to a destination 22. A plurality of first coefficients $EC1[i_n]$ (n=0, 1, 2, 3, ... ) (see FIG. 4a) are extracted from the first test signal received by the canceller 214 during a first period in step S31. Each one of the first coefficients $EC1[i_n]$ has an index $i_n$ corresponding to the received order. The first coefficients are then stored in the canceller 214 which can eliminate noise in step S32. Next, the hybrid 216 is switched to a second mode, i.e., a normal mode, to generate a second test signal by sending an original signal from the transmitter 210 to the destination 22 in step S33. A plurality of second coefficients $EC2[i_n]$ (n=0, 1, 2, 3, ... ) (see FIG. 4b) are extracted from the second test signal received by the canceller 214 during a second period in step S34. Each one of the second coefficients $EC2[i_n]$ has an index in corresponding to the received order. The second coefficients are stored in the canceller 214 and the canceller 214 is then frozen in step S35. A first index $I_1$ is determined when an absolute value of one of the first coefficients substantially exceeds a first threshold value with increasing order in step S36. The first index $I_1$ represents a substantial starting point of a propagation of the first test signal. Therefore, a referenced signal is obtained by subtracting the first coefficients from the second coefficients (see FIG. 4c). Referring to FIG. 3b, a peak $|EC2[i_N]-EC1[i_N]|$, a second index (see FIG. 4c), and a polarity of a peak of the referenced signal are determined in step S37. The second index $I_2$ is determined when an absolute value of one of referenced coefficients of the referenced signal substantially exceeds a second threshold value with increasing order, and the polarity of the peak is determined according to direction and a maximum value of the referenced signal which is obtained by subtracting the first coefficients from the second coefficients. A propagation delay can be obtained according to the first index and the second index. A location with a cabling issue is then determined by the propagation delay in step S38. The cabling issue is determined by an absolute value of the peak and the polarity of the peak in step S390. If the absolute value of the peak exceeds a third threshold value in step S390 and the polarity of the peak is positive in step S392, the cabling issue is an electrical open in step S394. If the absolute value of the peak exceeds a third threshold value in step S390 and the polarity of the peak is negative in step S392, the cabling issue is an electrical short in step S395. The cabling issue is an impedance mismatch between a characteristic impedance of the transmission line 23 (cable) and a load impedance when the absolute value of the peak is below a third threshold value in step S390. If the absolute value of the peak is below a third threshold value in step S390 and the polarity of the peak is positive in step S393, the load impedance is greater than the characteristic impedance in step S396. If the absolute value of the peak is below a third threshold value in step S390 and the polarity of the peak is negative in step S393, the load impedance is lower than the characteristic impedance in step S397.

As the mentioned above, the method includes the following steps. First, a plurality of first coefficients are extracted from a first test signal to be stored during a first period when a hybrid is set to a first mode. Next, a plurality of second coefficients are extracted from a second test signal to be stored during a second period after the hybrid is switched to a second mode. And then, a first index is determined when an absolute value of one of the first coefficients substantially exceeds a first threshold value. A second index and a polarity of a peak are determined according to a referenced signal that is obtained by subtracting the first coefficients from the second coefficients. At last, a location with a cabling issue is determined according to the first index and the second index.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for network diagnosis between a source end and a destination end coupled by a transmission line, wherein the source end comprises a transmitter, a receiver, a canceller, and a hybrid, comprising:
    transmitting a first test signal from the transmitter to the receiver when the hybrid is set to a first mode;
    extracting a plurality of first coefficients from the first test signal received by the canceller during a first period, wherein each one of the first coefficients has an index corresponding to a received order;
    switching the hybrid to a second mode to generate a second test signal by sending an original signal to the receiver and the destination;
    extracting a plurality of second coefficients from the second test signal received by the canceller during a second period, wherein each one of the second coefficients has an index corresponding to a received order;
    determining a first index when an absolute value of one of the first coefficients substantially exceeds a first threshold value;
    determining a second index and a polarity of a peak according to a referenced signal that is obtained by subtracting the first coefficients from the second coefficients; and
    determining a location with a cabling issue according to the first index and the second index.

2. The method for network diagnosis as claimed in claim 1, wherein the canceller is used to eliminate echo noise.

3. The method for network diagnosis as claimed in claim 1, wherein the hybrid is used to implement bi-directional full duplex transmission.

4. The method for network diagnosis as claimed in claim 1, wherein the first mode is a short mode and the second mode is a normal mode.

5. The method for network diagnosis as claimed in claim 1, wherein the method further comprises storing the first coefficients in the canceller before switching the hybrid to the second mode.

6. The method for network diagnosis as claimed in claim 1, wherein the method further comprises storing the second coefficients in the canceller and freezing the canceller before determining the second index.

7. The method for network diagnosis as claimed in claim 1, wherein the method further comprises selecting a third index to determine the cabling issue.

8. The method for network diagnosis as claimed in claim 1, wherein the method further comprises determining the cabling issue by an absolute value of the peak and the polarity of the peak.

9. The method for network diagnosis as claimed in claim 8, wherein the cabling issue is an electrical open when the absolute value of the peak exceeds a third threshold value and the polarity of the peak is positive.

10. The method for network diagnosis as claimed in claim 8, wherein the cabling issue is an electrical short when the absolute value of the peak exceeds a third threshold value and the polarity of the peak is negative.

11. The method for network diagnosis as claimed in claim 8, wherein the cabling issue is an impedance mismatch between a characteristic impedance of the transmission line and a load impedance when the absolute value of the peak is below a third threshold value.

12. A method for network diagnosis, comprising:
    extracting a plurality of first coefficients from a first test signal to be stored during a first period when a hybrid is set to a first mode;
    extracting a plurality of second coefficients from a second test signal to be stored during a second period after the hybrid is switched to a second mode;
    determining a first index when an absolute value of one of the first coefficients substantially exceeds a first threshold value;
    determining a second index and a polarity of a peak according to a referenced signal that is obtained by subtracting the first coefficients from the second coefficients; and
    determining a location with a cabling issue according to the first index and the second index.

13. The method for network diagnosis as claimed in claim 12, wherein the first test signal is sent from a source to a received end with transmitting none of the first test signal to a destination.

14. The method for network diagnosis as claimed in claim 12, wherein the first mode is a short mode with interrupting connection between a source and a destination.

15. The method for network diagnosis as claimed in claim 12, wherein the second test signal is sent from a source to a received end and a destination, and includes a transmission wave and a reflected wave.

16. The method for network diagnosis as claimed in claim 12, wherein the second mode is a normal mode with coupling a source and a destination.

17. The method for network diagnosis as claimed in claim 12, wherein the method further comprises determining the second index when an absolute value of one of referenced coefficients of the referenced signal substantially exceeds a second threshold value.

18. The method for network diagnosis as claimed in claim 12, wherein the method further comprises determining the cabling issue whether an absolute value of the peak of the second coefficients substantially exceeds a third threshold value.

19. The method for network diagnosis as claimed in claim 18, wherein the cabling issue is an electrical open when the absolute value of the peak exceeds the third threshold value and the polarity of the peak is positive.

20. The method for network diagnosis as claimed in claim 18, wherein the cabling issue is an electrical short when the absolute value of the peak exceeds the third threshold value and the polarity of the peak is negative.

21. The method for network diagnosis as claimed in claim 18, wherein the cabling issue is an impedance mismatch between a transmission line and a destination when the absolute value of the peak is below the third threshold value.

* * * * *